US008912073B2

(12) United States Patent
Ma et al.

(10) Patent No.: US 8,912,073 B2
(45) Date of Patent: Dec. 16, 2014

(54) METHOD OF MANUFACTURING SEMICONDUCTOR DEVICE

(71) Applicant: Shanghai Huali Microelectronics Corporation, Shanghai (CN)

(72) Inventors: Xu Ma, Shanghai (CN); Wei Zhou, Shanghai (CN); Yamin Cao, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 0 days.

(21) Appl. No.: 14/103,496

(22) Filed: Dec. 11, 2013

(65) Prior Publication Data

US 2014/0302662 A1 Oct. 9, 2014

(30) Foreign Application Priority Data

Apr. 9, 2013 (CN) .......................... 2013 1 0122105

(51) Int. Cl.
*H01L 21/76* (2006.01)
*H01L 21/762* (2006.01)

(52) U.S. Cl.
CPC ................................ *H01L 21/76224* (2013.01)
USPC .......................................... 438/424; 438/704

(58) Field of Classification Search
USPC ......................................... 438/400, 424, 704
See application file for complete search history.

(56) References Cited

U.S. PATENT DOCUMENTS

2003/0129771 A1* 7/2003 Summerfelt et al. ............. 438/3

* cited by examiner

*Primary Examiner* — Bradley K Smith
(74) *Attorney, Agent, or Firm* — Muncy, Geissler, Olds & Lowe, P.C.

(57) ABSTRACT

A method of manufacturing a semiconductor device is disclosed, which can completely remove hard mask residues left along boundaries between a high-voltage device region and STI structures after a dry etch process, by partially reducing a thickness of each of the exposed portion of the respective STI structures adjacent to the high-voltage device region so as to sufficiently expose the residues. As a result, after a portion of an underlying pad oxide corresponding to the high-voltage device region is removed in a subsequent process, the exposed surface of the substrate is uniform with a smooth and clear border. Therefore, no sharp corners will emerge at a border of a gate oxide subsequently grown on the exposed surface of the substrate, and the gate oxide is thus morphologically improved, thereby resulting in an improvement of the reliability of the high-voltage semiconductor device being fabricated.

14 Claims, 4 Drawing Sheets

METHOD OF MANUFACTURING SEMICONDUCTOR DEVICE

CROSS-REFERENCES TO RELATED APPLICATIONS

This application claims the priority of Chinese patent application number 201310122105.X, filed on Apr. 9, 2013, the entire contents of which are incorporated herein by reference.

TECHNICAL FIELD

The present invention relates generally to the field of integrated circuit (IC) fabrication, and more particularly, to a method of manufacturing a semiconductor device.

BACKGROUND

High-voltage integrated circuits have been widely used in panel display, communications circuitry, automobile electronics and many other applications. Such a high-voltage integrated circuit typically includes a low-voltage logic section and a high-voltage section which operates under the control of a signal output from the low-voltage logic section and thereafter shifted to a high voltage level after passing through a high-voltage driver circuit containing high-voltage devices.

In general, a high-voltage integrated circuit includes both high-voltage devices and low-voltage devices, the high-voltage devices each incorporating a thick gate oxide which ensures high gate-source resistance for the device and the low-voltage devices each typically employing a thin gate oxide. For example, a conventional High-Voltage Complementary Metal Oxide Semiconductor (HV CMOS) device typically includes a gate oxide with a thickness of about 100 nm, whilst a conventional Low-Voltage (LV) CMOS device typically employs a gate oxide with a thickness of about 2.5 nm. Thus, in order to integrate HV and LV CMOS devices on a single chip, a special technique is needed to form gate oxides of different thicknesses on the same chip.

In this regard, the so-called LOCOS (LOCalised Oxidation of Silicon) scheme using silicon-nitride as a hard mask is an effective method adopted in the prior art to selectively grow thick oxides, serving as isolations (e.g., shallow trench isolations (STIs)) or field oxides, over heavily doped silicon regions except where it is actually intended for active transistors. However, in the prior art, due to a sloping boundary between the active area and the STI, silicon nitride residues topographically resembling sidewalls along the boundary occur after a dry etch process performed on the silicon-nitride hard mask. Such residues will cause defects in subsequent process steps and increase the difficulty to completely remove an underlying pad oxide. This will lead to a border of the active area with sharp corners after a gate oxide is grown, thus decreasing the breakdown voltage of the device being fabricated and deteriorating its gate oxide integrity (GOI) performance.

SUMMARY OF THE INVENTION

It is therefore an object of the present invention to address the silicon nitride residues issue of the prior art so as to morphologically improve a gate oxide and hence the reliability of the high-voltage semiconductor device being fabricated by presenting a method of manufacturing a semiconductor device.

The foregoing object is attained by a method of manufacturing a semiconductor device, including the steps of:

1) providing a substrate and forming a pad oxide over the substrate;
2) etching the pad oxide and the substrate to form two shallow trenches and filling the two shallow trenches with an oxide to form two shallow trench isolation structures, a high-voltage device region being provided between the two shallow trench isolation structures.
3) forming a hard mask layer over the substrate;
4) performing a dry etching process to remove a portion of the hard mask layer in the high-voltage device region to expose both a portion of the pad oxide in the high-voltage device region and adjacent portions of the respective shallow trench isolation structures, wherein hard mask residues are left along boundaries between the high-voltage device region and the shallow trench isolation structures after the dry etching process;
5) reducing a thickness of each of the exposed portions of the respective shallow trench isolation structures using a first rinsing liquid to expose the hard mask residues; and
6) removing the hard mask residues using a second rinsing liquid.

Optionally, both the pad oxide and the oxide filled in the shallow trenches may be silicon oxide, and in the step 5), a thickness of the exposed portion of the pad oxide in the high-voltage device region may be also reduced.

Optionally, the method may further include the steps of:

7) completely removing the portion of the pad oxide in the high-voltage device region using the first rinsing liquid to expose the substrate in the high-voltage device region; and
8) forming a high-voltage gate oxide over the exposed substrate in the high-voltage device region.

Optionally, in the step 7), the thickness of each of the exposed portions of the respective STI structures may be further reduced until a surface of each of the exposed portions of the respective shallow trench isolation structures is leveled with the exposed substrate in the high-voltage device region.

Optionally, the high-voltage gate oxide may have a thickness of 90 nm to 110 nm.

Optionally, the first rinsing liquid may be hydrofluoric acid.

Optionally, the first rinsing liquid may be a mixture of hydrofluoric acid and ammonium fluoride.

Optionally, the first rinsing liquid may be a mixture of hydrofluoric acid and phosphoric acid.

Optionally, the first rinsing liquid may be a mixture of hydrofluoric acid, ammonium fluoride and phosphoric acid.

Optionally, the hard mask layer may be formed of silicon nitride.

Optionally, the second rinsing liquid may be phosphoric acid.

Optionally, the pad oxide may have a thickness of 90 Å to 140 Å, and the hard mask layer may have a thickness of 250 Å to 400 Å.

Optionally, in the step 5), the thickness of each of the exposed portions of the respective STI structures may be reduced by 100 Å to 300 Å.

Optionally, in the step 6), a rinsing duration for removing the hard mask residues may be from 1 minute to 3 minutes.

As indicated above, the method of the present invention can completely remove the hard mask residues left along the boundaries between the high-voltage device region and the STI structures after the dry etch process is performed to remove the hard mask layer in the high-voltage device region, by lowering the removal difficulty through partially reducing a thickness of each of the exposed portions of the respective STI structures adjacent to the high-voltage device region to sufficiently expose the hard mask residues. As such, after the pad oxide in the high-voltage device region is removed in the subsequent process, the exposed surface of the underlying substrate is uniform with a smooth and clear border. Accordingly, no sharp corners will emerge at the border of the gate oxide subsequently grown on the exposed surface and the gate oxide is thus morphologically improved, which results in an improvement of the reliability of the high-voltage semiconductor device being fabricated.

DETAILED DESCRIPTION

The present invention provides a method of manufacturing a semiconductor device. To further describe the method of the invention, reference is made to the following detailed description of exemplary embodiments, taken in conjunction with the accompanying drawings. Features and advantages of the invention will be apparent from the following detailed description, and from the claims. Note that all the drawings are presented in a very simple form and not drawn precisely to scale. They are provided solely to facilitate the description of the exemplary embodiments of the invention in a convenient and clear way.

Figure 1:
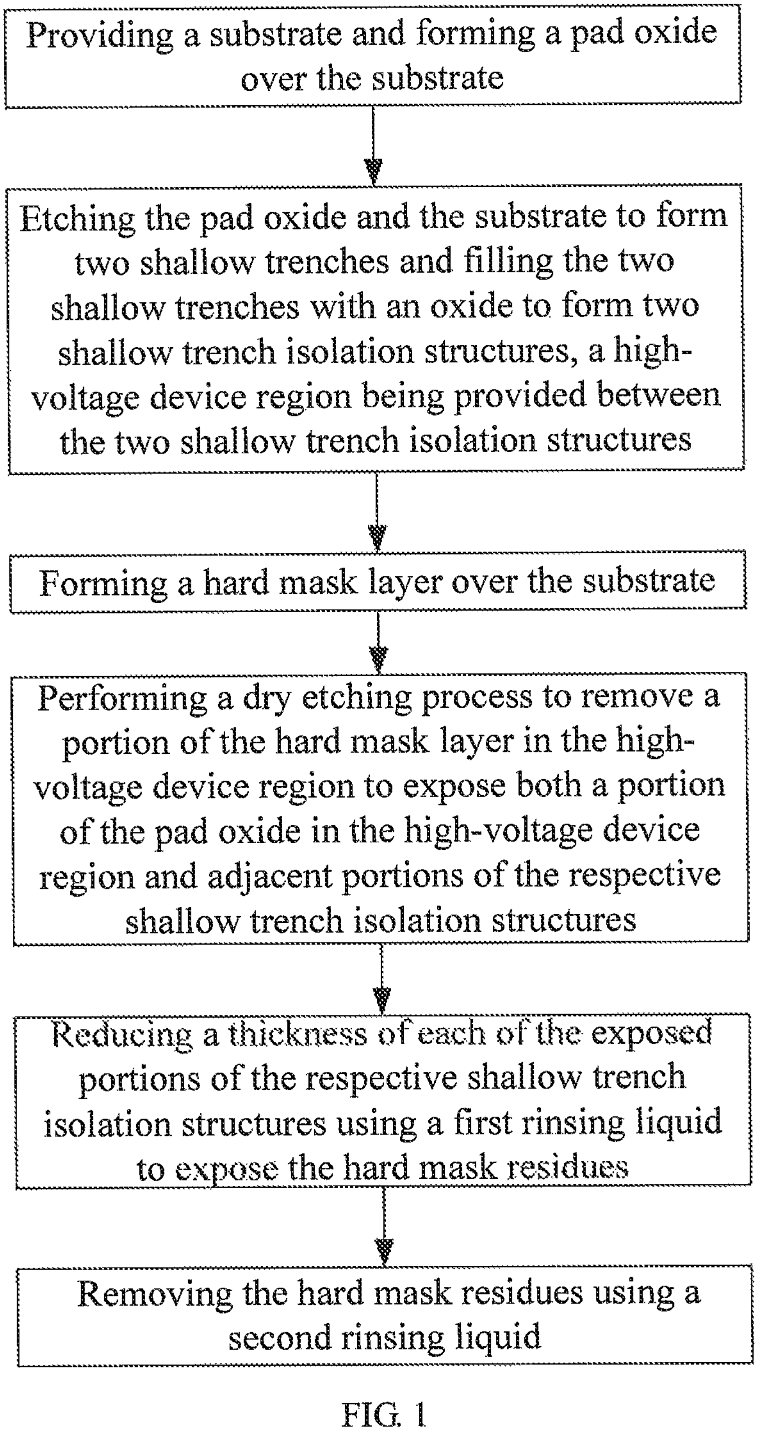
FIG. 1 depicts a flowchart graphically illustrating a method of manufacturing a semiconductor device in accordance with an embodiment of the present invention.

FIG. 1 is a flowchart graphically illustrating a method of manufacturing a semiconductor device in accordance with an embodiment of the present invention.

Reference is given to FIGS. 2 to 7 below to describe in further detail process steps of a method of manufacturing a semiconductor device in accordance with an embodiment of the present invention.

Figure 2:
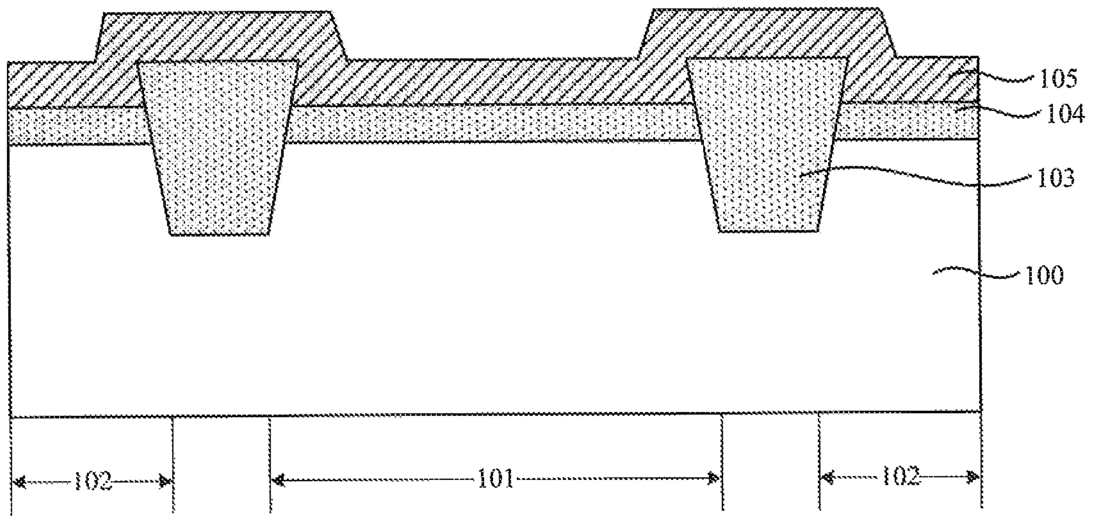
FIGS. 2 to 7 are cross-sectional views depicting the sequence of process steps of a method of manufacturing a semiconductor device in accordance with an embodiment of the present invention.

Referring first to FIG. 2, in a first step of the method, a substrate indicated at 100 is provided.

The substrate 100 includes a high-voltage device region 101 and low-voltage device regions 102 spaced by shallow trench isolation (STI) structures 103. A pad oxide 104 is formed over the substrate 100, covering both the high-voltage device region 101 and the low-voltage device regions 102. A hard mask layer 105 is formed over both the pad oxide 104 and the STI structures 103. The high-voltage device region 101 is partially overlapped with the STI structures 103.

The pad oxide 104 may have a thickness of 90 Å to 140 Å. The hard mask layer 105 may be a silicon nitride layer with a thickness of 250 Å to 400 Å.

Figure 3:
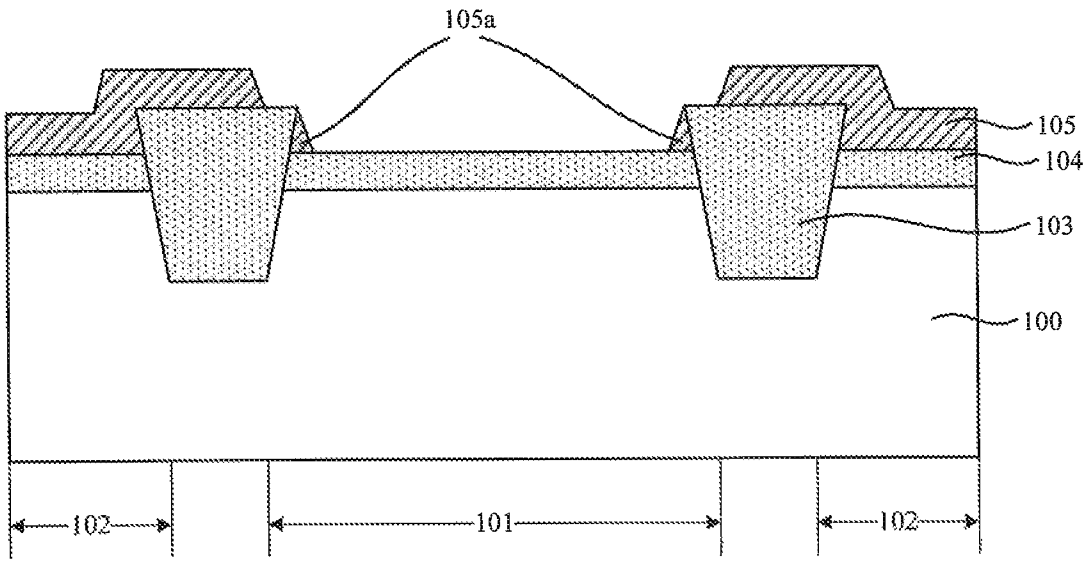

In a second step of the method, as shown in FIG. 3, a dry etch process is performed to removed a portion of the hard mask layer 105 in the high-voltage device region 101.

Specifically, in this step, after the dry etch process is performed, the portion of the hard mask layer 105 in the high-voltage device region 101 is removed, thus exposing a portion of the underlying pad oxide 104 and portions of the respective STI structures 103. Both the STI structures 103 and the pad oxide 104 may be made of silicon oxide.

In this way, due to a high etching selectivity ratio between silicon oxide and silicon nitride, the STI structures 103 and the pad oxide 104 will not be affected during the dry etch process performed on the hard mask layer 105. However, as the STI structures 103 are broader at the top and narrower at the bottom and protrudes upwardly out of the pad oxide 104, the sloping boundaries of the STI structures 103 will prevent the removal of the underlying portions of the hard mask layer 105. Consequently, portions of the hard mask layer 105 that topographically resemble sidewalls for the STI structures 103 remain along boundaries between the high-voltage device region 101 and the STI structures 103 after the dry etch process, which will be referred to hereinafter as "hard mask residues" indicated at 105*a*.

Figure 4:
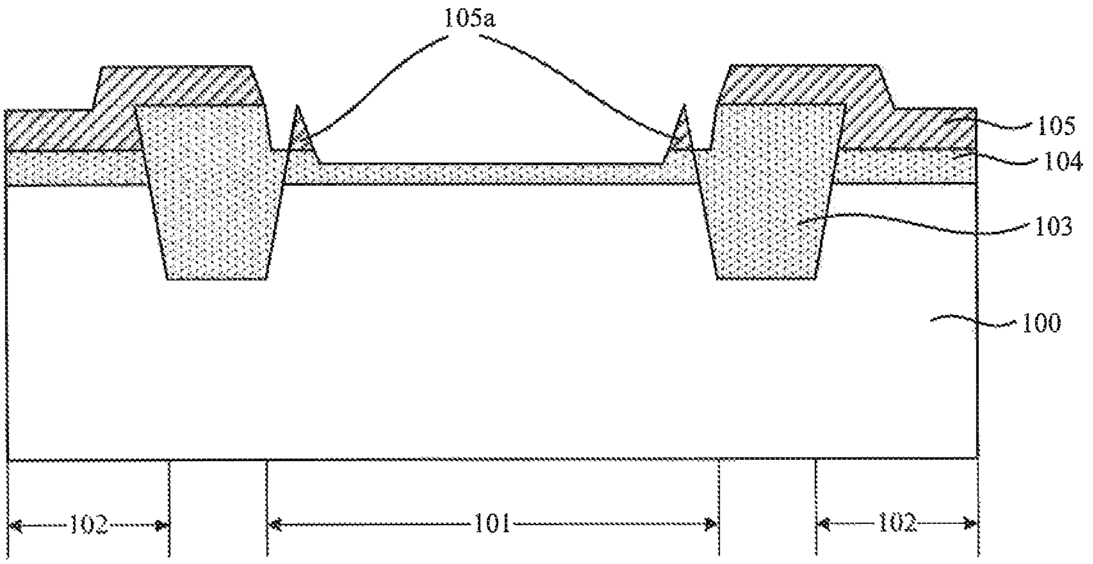

Referring to FIG. 4, in a third step of the method, a thickness of each of the exposed portions of the respective STI structures 103 overlapping the high-voltage device region 101 are reduced using a first rinsing liquid, thus exposing the hard mask residues 105*a* located along the boundaries between the high-voltage device region 101 and the STI structures 103.

The first rinsing liquid may include an etching liquid having a high etching selectivity against silicon oxide and a low etching selectivity against silicon nitride, in order to prevent the portion of the hard mask layer 105 covering the low-voltage device regions 102 from being damaged during the etching of the STI structures 103. More specifically, the first rinsing may be one selected from the group consisting of hydrofluoric acid, a mixture of hydrofluoric acid and ammonium fluoride, a mixture of hydrofluoric acid and phosphoric acid, and a mixture of hydrofluoric acid, ammonium fluoride and phosphoric acid.

Preferably, in this step, the thicknesses of the STI structures 103 in the portions overlapping the high-voltage device region 101 can be reduced by about 100 Å to about 300 Å. Concurrently, the portion of the pad oxide 104 between the STI structures 103 may also be reduced by the nearly same thickness, or completely removed. As a result, the hard mask residues 105*a* are sufficiently exposed after this step.

Figure 5:
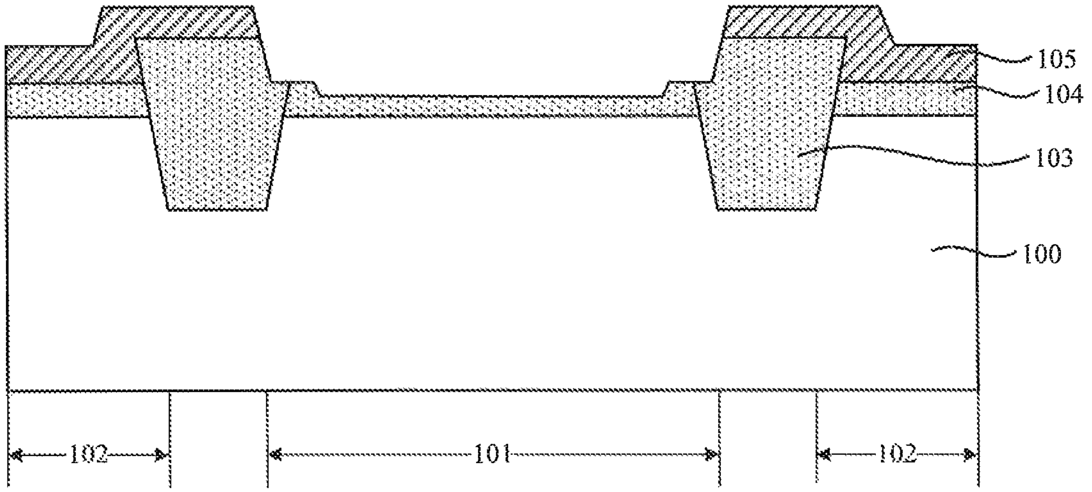

In a fourth step of the method, with reference to FIG. 5, the hard mask residues 105*a* left along the boundaries between the high-voltage device region 101 and the STI structures 103 are removed with a second rinsing liquid.

Specifically, the second rinsing liquid may include an etching liquid having a high etching selectivity against silicon nitride and a low etching selectivity against silicon oxide, such as phosphoric acid.

Due to possible damage of the portion of the hard mask layer 105 covering the low-voltage device regions 102 during the etching of the hard mask residues 105*a*, the rinsing should not be performed for a long duration, and may be preferably stopped at the moment when the hard mask residues 105*a* are just totally etched away. In practical implementation, the rinsing time can be properly determined based on a combined consideration of the thickness of the hard mask layer 105 and the size of the hard mask residues 105*a*. Preferably, the rinsing duration can be from 1 minute to 3 minutes. Further, in order to avoid a discrepancy between the thickness of the hard mask layer 305 after this step and the design value thereof required by the device being fabricated, an additional sacrificial thickness for compensation for the thickness loss in this step should be taken into considerations during the formation of the hard mask layer 305 in the previous first step.

Figure 6:
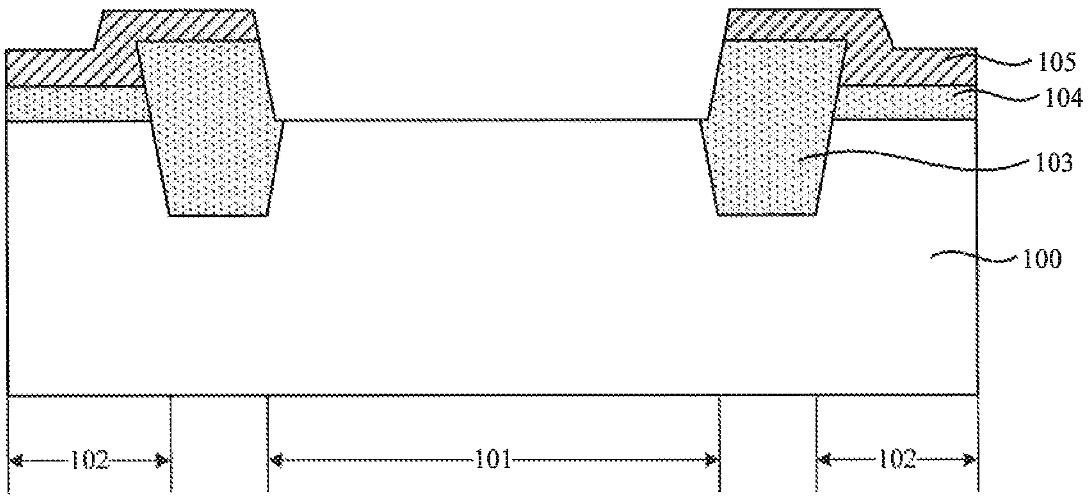

In a fifth step of the method, as shown in FIG. 6, the portion of the pad oxide 104 in the high-voltage device region 101 is removed using a first etching liquid to expose the underlying substrate 100 in the high-voltage device region 101.

Specifically, in this step, the first etching liquid is used to remove both the portion of the pad oxide 104 and portions of the respective STI structures 103 in the high-voltage device region 101, and accordingly, the substrate 100 and the respective STI structures 103 in the high-voltage device region 101 are exposed. The first etching liquid may be same as that used as the first rinsing liquid.

In the case that the pad oxide 104 in the high-voltage device region 101 has been completely removed in the third step, this step may be omitted and the previous fourth step is immediately followed by a sixth step described below rather than this step.

Alternatively, the thickness of each of the exposed portions of the respective STI structures 103 overlapping the high-voltage device region 101 may be further reduced in this step using the first etching liquid until a surface of each of the exposed portions of the respective shallow trench isolation structures is leveled with the exposed substrate 100 in the high-voltage device region, before proceeding to the next sixth step.

Figure 7:
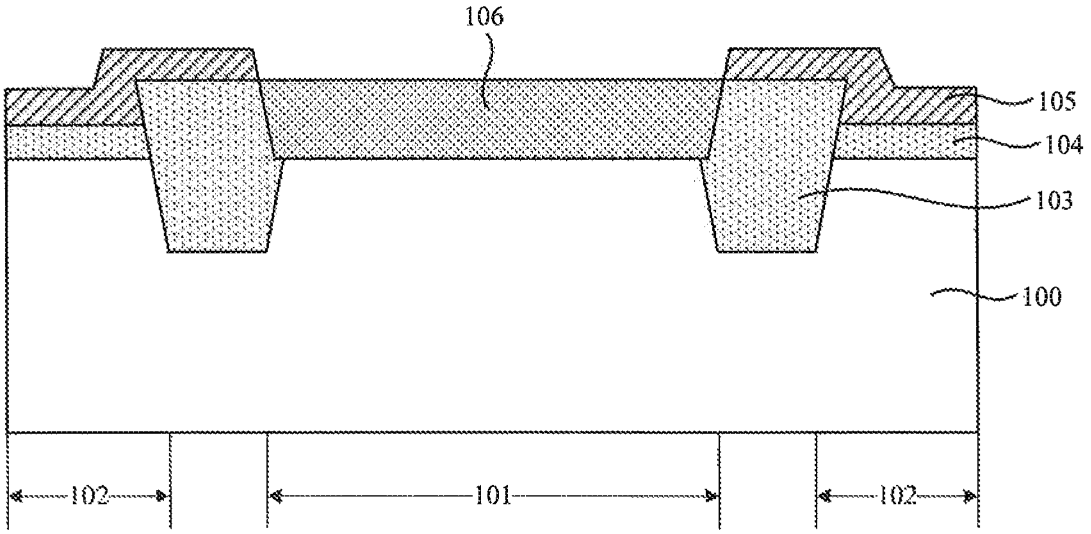

Referring to FIG. 7, in the sixth step of the method, a high-voltage gate oxide 106 is formed, covering the exposed portion of the substrate 100 and exposed portions of the respective STI structures 103 in the high-voltage device region 101.

The high-voltage gate oxide 106 can serve as a voltage-sustaining layer, the thickness of which determines the voltage-resistance performance of the high-voltage device being fabricated and may generally be of a magnitude of 90 nm to 110 nm.

As stated above, the method of the present invention can completely remove the hard mask residues left along the boundaries between the high-voltage device region and the STI structures after the dry etch process is performed to remove the hard mask layer in the high-voltage device region, by lowering the removal difficulty through partially reducing a thickness of each of the exposed portions of the respective STI structures adjacent to the high-voltage device region to sufficiently expose the hard mask residues. As such, after the pad oxide in the high-voltage device region is removed in the subsequent process, the exposed surface of the underlying substrate is uniform with a smooth and clear border. Accordingly, no sharp corners will emerge at the border of the gate oxide subsequently grown on the exposed surface and the gate oxide is thus morphologically improved, which results in an improvement of the reliability of the high-voltage semiconductor device being fabricated.

While the invention has been described in conjunction with the detailed description of a preferred embodiment thereof, the foregoing description is intended to illustrate and not limit the scope of the invention. All modifications and variations made by those skilled in the art in light of the above teachings are considered to be within the scope of the appended claims.

What is claimed is:

1. A method of manufacturing a semiconductor device, comprising the steps of:

1) providing a substrate and forming a pad oxide over the substrate;

2) etching the pad oxide and the substrate to form two shallow trenches and filling the two shallow trenches with an oxide to form two shallow trench isolation structures, a high-voltage device region being provided between the two shallow trench isolation structures;

3) forming a hard mask layer over the substrate;

4) performing a dry etching process to remove a portion of the hard mask layer in the high-voltage device region to expose both a portion of the pad oxide in the high-voltage device region and adjacent portions of the respective shallow trench isolation structures, wherein hard mask residues are left along boundaries between the high-voltage device region and the shallow trench isolation structures after the dry etching process;

5) reducing a thickness of each of the exposed portions of the respective shallow trench isolation structures using a first rinsing liquid to expose the hard mask residues; and 6) removing the hard mask residues using a second rinsing liquid.

2. The method of claim 1, wherein both the pad oxide and the oxide filled in the shallow trenches are silicon oxide, and wherein in the step 5), a thickness of the exposed portion of the pad oxide in the high-voltage device region is also reduced.

3. The method of claim 2, further comprising the steps of:

7) completely removing the portion of the pad oxide in the high-voltage device region using the first rinsing liquid to expose the substrate in the high-voltage device region; and 8) forming a high-voltage gate oxide over the exposed substrate in the high-voltage device region.

4. The method of claim 3, wherein in the step 7), the thickness of each of the exposed portions of the respective shallow trench isolation structures is further reduced until a surface of each of the exposed portions of the respective shallow trench isolation structures is leveled with the exposed substrate in the high-voltage device region.

5. The method of claim 3, wherein the high-voltage gate oxide has a thickness of 90 nm to 110 nm.

6. The method of claim 2, wherein the first rinsing liquid is hydrofluoric acid.

7. The method of claim 2, wherein the first rinsing liquid is a mixture of hydrofluoric acid and ammonium fluoride.

8. The method of claim 2, wherein the first rinsing liquid is a mixture of hydrofluoric acid and phosphoric acid.

9. The method of claim 2, wherein the first rinsing liquid is a mixture of hydrofluoric acid, ammonium fluoride and phosphoric acid.

10. The method of claim 1, wherein the hard mask layer is formed of silicon nitride.

11. The method of claim 10, wherein the second rinsing liquid is phosphoric acid.

12. The method of claim 1, wherein the pad oxide has a thickness of 90 Å to 140 Å and the hard mask layer has a thickness of 250 Å to 400 Å.

13. The method of claim 1, wherein in the step 5), the thickness of each of the exposed portions of the respective shallow trench isolation structures are reduced by 100 Å to 300 Å.

14. The method of claim 1, wherein in the step 6), a rinsing duration for removing the hard mask residues is from 1 minute to 3 minutes.

* * * * *